(12) United States Patent
Lesea

(10) Patent No.: US 7,684,232 B1
(45) Date of Patent: Mar. 23, 2010

(54) MEMORY CELL FOR STORING A DATA BIT VALUE DESPITE ATOMIC RADIATION

(75) Inventor: Austin H. Lesea, Los Gatos, CA (US)

(73) Assignee: XILINX, Inc., San Jose, CA (US)

( * ) Notice: Subject to any disclaimer, the term of this patent is extended or adjusted under 35 U.S.C. 154(b) by 385 days.

(21) Appl. No.: 11/900,549

(22) Filed: Sep. 11, 2007

(51) Int. Cl.
*G11C 11/00* (2006.01)

(52) U.S. Cl. ........................ 365/154; 365/106
(58) Field of Classification Search ............ 365/63, 365/72, 154, 156, 188; 257/368, 393
See application file for complete search history.

(56) References Cited

U.S. PATENT DOCUMENTS

| | | | |
|---|---|---|---|
| 4,638,463 A | 1/1987 | Rockett, Jr. | |
| 4,725,875 A | 2/1988 | Hsueh | |
| 4,852,060 A | 7/1989 | Rockett, Jr. | |
| 4,879,690 A | 11/1989 | Anami et al. | |
| 4,884,238 A | 11/1989 | Lee et al. | |
| 4,903,094 A | 2/1990 | Plus et al. | |
| 4,912,675 A | 3/1990 | Blake et al. | |
| 4,956,814 A | 9/1990 | Houston | |
| 4,984,203 A | 1/1991 | Shookhtim et al. | |
| 5,018,102 A * | 5/1991 | Houston | 365/95 |
| 5,046,044 A | 9/1991 | Houston et al. | |
| 5,126,279 A | 6/1992 | Roberts | |
| 5,189,598 A | 2/1993 | Bolan et al. | |
| 5,212,108 A | 5/1993 | Liu et al. | |
| 5,220,532 A | 6/1993 | Kertis | |
| 5,301,146 A | 4/1994 | Hama | |
| 5,307,142 A | 4/1994 | Corbett et al. | |
| 5,311,070 A | 5/1994 | Dooley | |
| 5,341,009 A | 8/1994 | Young et al. | |
| 5,396,454 A | 3/1995 | Nowak | |
| 5,489,544 A | 2/1996 | Rajeevakumar | |

(Continued)

FOREIGN PATENT DOCUMENTS

EP 0281741 9/1988

(Continued)

OTHER PUBLICATIONS

STMicroelectronics; "New Chip Technology from STMicroelectronic Eliminates "Soft Error" Threat to Electronic Systems"; downloaded on Mar. 15, 2004 from http://www.stmicroelectronics.com/stonline/press/news/year2003/ t1394h.htm; pp. 1-3.

(Continued)

*Primary Examiner*—Son Dinh
*Assistant Examiner*—Harry W Byrne
(74) *Attorney, Agent, or Firm*—LeRoy D. Maunu

(57) ABSTRACT

A memory cell stores a data bit value despite atomic radiation. The memory cell includes two inverters, an access circuit, and two switch circuits. Each inverter has an input and an output. The access circuit is arranged to write and read the data bit value in the memory cell. The switch circuits cross couple the outputs of the two inverters to the inputs of the two inverters. The switch circuits are arranged to alternately decouple and couple the inputs of the two inverters to limit corruption from atomic radiation of the data bit value in the memory cell.

20 Claims, 4 Drawing Sheets

U.S. PATENT DOCUMENTS

| | | | |
|---|---|---|---|
| 5,504,703 | A | 4/1996 | Bansal |
| 5,631,863 | A | 5/1997 | Fechner et al. |
| 5,681,769 | A | 10/1997 | Lien |
| 5,691,935 | A | 11/1997 | Douglass |
| 5,844,837 | A | 12/1998 | Yoshikawa |
| 5,889,431 | A | 3/1999 | Csanky |
| 5,905,290 | A | 5/1999 | Houston |
| 5,917,212 | A | 6/1999 | Blake et al. |
| 5,917,221 | A | 6/1999 | Takemura |
| 6,049,487 | A | 4/2000 | Plants et al. |
| 6,058,041 | A | 5/2000 | Golke et al. |
| 6,104,631 | A | 8/2000 | El-Sharawy et al. |
| 6,111,780 | A | 8/2000 | Bertin |
| 6,172,907 | B1 | 1/2001 | Jenne |
| 6,180,984 | B1 | 1/2001 | Golke et al. |
| 6,252,433 | B1 | 6/2001 | Stecklein |
| 6,265,764 | B1 | 7/2001 | Kinsman |
| 6,271,568 | B1 | 8/2001 | Woodruff et al. |
| 6,278,287 | B1 | 8/2001 | Baze |
| 6,369,630 | B1 | 4/2002 | Rockett, Jr. |
| 6,377,097 | B1 | 4/2002 | Shuler, Jr. |
| 6,510,076 | B1 | 1/2003 | Lapadat et al. |
| 6,549,443 | B1 | 4/2003 | Jensen et al. |
| 6,649,456 | B1 | 11/2003 | Liaw |
| 6,656,803 | B2 | 12/2003 | Chan |
| 6,667,523 | B2 | 12/2003 | Woodbury et al. |
| 6,703,858 | B2 | 3/2004 | Knowles |
| 6,717,233 | B1 | 4/2004 | Haddad et al. |
| 6,735,110 | B1 | 5/2004 | Lesea |
| 6,744,661 | B1 | 6/2004 | Shubat |
| 6,809,957 | B2 | 10/2004 | Lesea |
| 6,867,131 | B2 | 3/2005 | Wang et al. |
| 6,870,404 | B1 | 3/2005 | Maangat |
| 6,876,572 | B2 | 4/2005 | Turner |
| 6,908,821 | B2 | 6/2005 | Kim |
| 6,914,804 | B2 | 7/2005 | Lesea |
| 6,961,279 | B2 | 11/2005 | Simko |
| 6,970,374 | B2 | 11/2005 | Lin |
| 6,980,462 | B1 | 12/2005 | Ramesh |
| 6,982,197 | B2 | 1/2006 | Ku et al. |
| 6,982,451 | B1 | 1/2006 | Voogel et al. |
| 7,064,574 | B1 | 6/2006 | Voogel et al. |
| 7,110,281 | B1 | 9/2006 | Voogel et al. |
| 7,145,194 | B2 | 12/2006 | Nishida et al. |
| 7,193,885 | B2 * | 3/2007 | McCollum ............... 365/154 |
| 7,214,990 | B1 | 5/2007 | Lee et al. |
| 2007/0139998 | A1 * | 6/2007 | McCollum ............... 365/154 |

FOREIGN PATENT DOCUMENTS

| | | |
|---|---|---|
| FR | 2353928 | 3/1977 |
| JP | 4129094 | 4/1992 |
| JP | 407161843 A | 6/1995 |
| JP | 409036252 A | 2/1997 |
| JP | 02002083882 A | 3/2002 |
| JP | 02004146844 A | 5/2004 |
| JP | 020044342790 A | 12/2004 |
| WO | WO9963542 A1 | 12/1999 |
| WO | WO03/090229 A2 | 10/2003 |

OTHER PUBLICATIONS

U.S. Appl. No. 11/242,409 Voogel, et al. "Improving Single Event Upset in SRAM Cells in FPGAs with High Resistivity Gate Structure", filed Sep. 30, 2005, 28 pages, Xilinx, Inc. 2100 Logic Drive, San Jose, California.

U.S. Appl. No. 11/503,588 Voogel, et al., "Memory Cells Utilizing Metal-To Metal Capacitors to Reduce Susceptibility to Single Event Upsets", filed Aug. 14, 2006, 31 pages, Xilinx, Inc. 2100 Logic Drive, San Jose, California.

U.S. Appl. No. 11/503,694 Voogel, et al., "Memory Cells Utilizing Metal-To Metal Capacitors to Reduce Susceptibility to Single Event Upsets", filed Aug. 14, 2006, 31 pages, Xilinx, Inc. 2100 Logic Drive, San Jose, California.

* cited by examiner

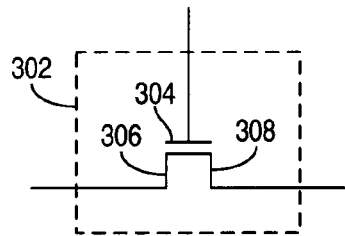
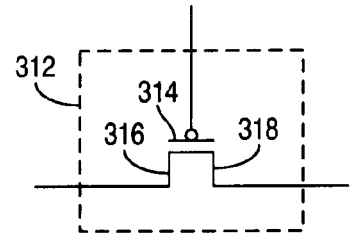
FIG. 3A          FIG. 3B
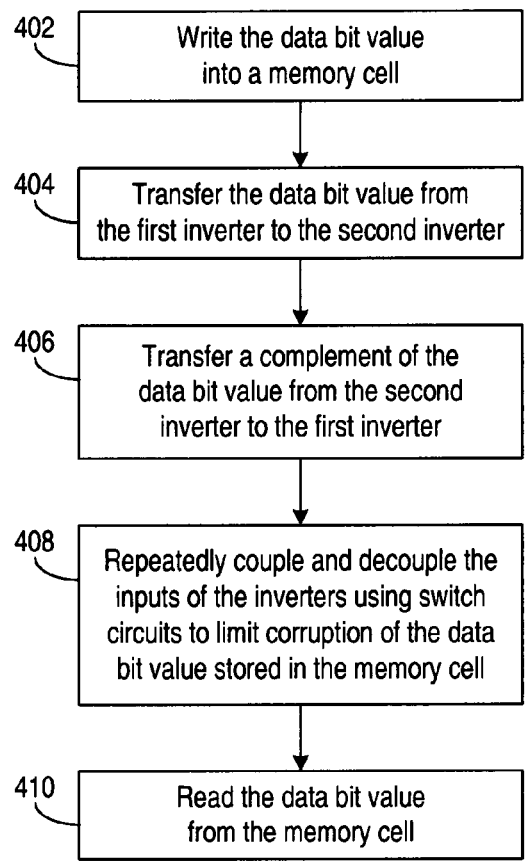
FIG. 4

US 7,684,232 B1

MEMORY CELL FOR STORING A DATA BIT VALUE DESPITE ATOMIC RADIATION

FIELD OF THE INVENTION

The present invention generally relates to semiconductor memory, and more particularly to circuits for radiation hardening of semiconductor memory.

BACKGROUND

Data stored in the memory of a semiconductor device can become corrupted by the effects of cosmic radiation and atomic particles generated from radioactive decay. Cosmic radiation may collide with atoms in the Earth's atmosphere or atoms in the packaging of the semiconductor device. These collisions may create a chain of secondary particles. Similarly, atomic particles, such as alpha particles, from radioactive decay may collide with atoms in the packaging of the semiconductor device and create a chain of secondary particles. These chains of secondary particles may include charged particles, such as electrons, that are injected into the semiconductor device.

The cumulative charge from a chain of secondary particles may change the voltage at a node of the semiconductor device. Often the change is transient, without any permanent effect on the semiconductor device or the intended operation of the semiconductor device. However, certain circuits, such as static random access memory (SRAM), are susceptible to corruption of the data stored in the SRAM. Typically, the atomic radiation does not permanently damage the semiconductor device.

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from an external PROM or written into the FPGA by an external device. The collective states of the individual memory cells then determine the function of the FPGA.

If atomic radiation corrupts one of these memory cells, the atomic radiation may alter the function of the FPGA. Thus, the FPGA may operate improperly until the FPGA is reset to reload the configuration data into the FPGA.

The present invention may address one or more of the above issues.

SUMMARY

Various embodiments of the invention provide a memory cell for storing a data bit value despite atomic radiation. The memory cell includes two inverters, an access circuit, and two switch circuits. Each inverter has an input and an output. The access circuit is arranged to write and read the data bit value in the memory cell. The switch circuits cross couple the outputs of the two inverters to the inputs of the two inverters. The switch circuits are arranged to alternately decouple and couple the inputs of the two inverters to limit corruption from atomic radiation of the data bit value in the memory cell.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which:

FIGS. 3A and 3B are circuit diagrams of an alternative implementation of transmission devices of FIG. 2 in accordance with one or more embodiments of the invention;

FIG. 4 is a flow diagram of a process for storing a data bit value in a memory cell in accordance with various embodiments of the invention.

DETAILED DESCRIPTION OF THE DRAWINGS

Figure 1A:
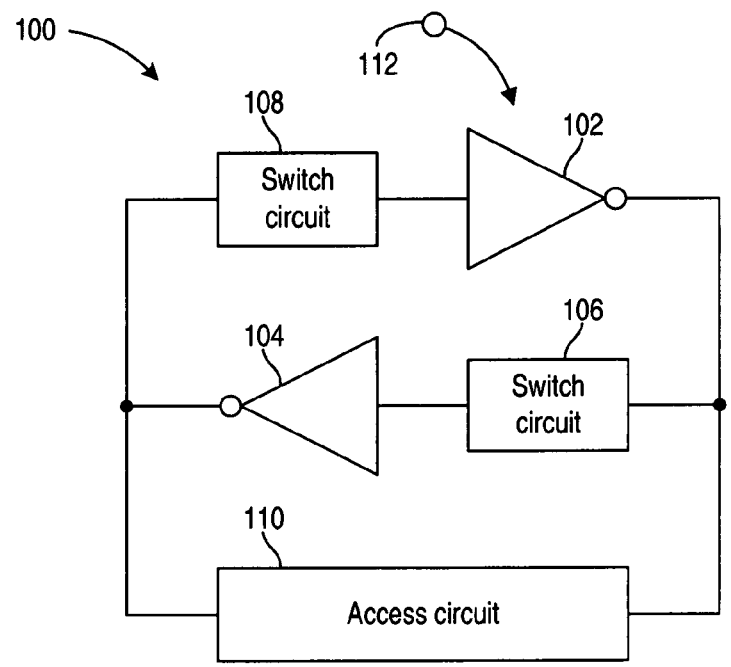
FIGS. 1A and 1B are block diagrams of memory cells for storing a data bit value in accordance with various embodiments of the invention.
Figure 1B:
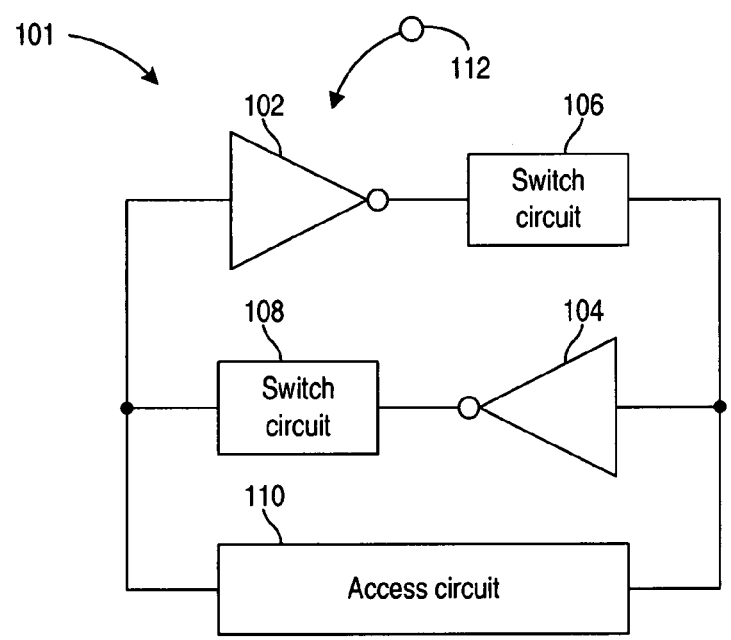

FIGS. 1A and 1B are block diagrams of memory cells 100 and 101, respectively, for storing a data bit value in accordance with various embodiments of the invention. Inverters 102 and 104 are cross-coupled by switch circuits 106 and 108. The switch circuits 106 and 108 may improve the resistance to corruption of data stored in memory cells 100 and 101 from atomic radiation 112. In the memory cell 100 of FIG. 1A, the access circuit 110 is connected to the outputs of the inverters 102 and 104, while in the memory cell 101 of FIG. 1B, the access circuit 110 is connected to the inputs of the inverters 102 and 104.

Atomic radiation 112 may strike an integrated circuit that includes the inverters 102 and 104, the switch circuits 106 and 108, and the access circuit 110. The atomic radiation may create a trail of electrons and holes in the semiconductor substrate of the integrated circuit. Depending upon the electrical fields in the substrate, the electrons or the holes may be swept into the source or drain region of a nearby MOS transistor, such as a MOS transistor in inverters 102 or 104. Because the gate of a MOS transistor is isolated from the substrate, generally atomic radiation does not directly affect the gate of a MOS transistor. However, the cumulative negative charge of the electrons or the cumulative positive charge of the holes may briefly affect the voltage driven at the output of the inverter 102 or 104. The brief change in voltage may be of sufficient magnitude to change briefly the logic value driven from inverter 102 or 104.

A brief change in the logic value driven from inverter 102 may become a lasting change when the brief change propagates back to the input of inverter 102 via inverter 104 and closed switch circuits 106 and 108. Thus, atomic radiation may cause a brief change of the logic value that becomes a lasting change of the logic value. Switch circuits 106 and 108 should be closed for the brief change in value to circulate through the inverters 102 and 104.

When switch circuit 106 is open during a brief change in the logic value driven from inverter 102, the brief change cannot circulate through inverter 104. Opening switch circuit 106 prevents data corruption from atomic radiation that affects the output of inverter 102. While switch circuit 106 is open, the logic value is retained on the input capacitance of inverter 104.

The level of the logic value retained on the input capacitance of inverter 104 may slowly decay while switch circuit 106 is open. Closing switch 106 may restore the level of the logic value. However, corruption from atomic radiation is possible while switch 106 is closed. Thus, switch circuit 106 may be closed just long enough to ensure restoration of the level, and then switch circuit 106 may be opened until level restoration is needed again.

Switch circuit 108 may operate similarly to prevent corruption of the data value from atomic radiation that affects the output of inverter 104.

Switch circuits 106 and 108 may open and close repeatedly. The duty cycle of switch circuits 106 and 108 may determine the factor of improved tolerance of atomic radiation. In one embodiment, switch circuits 106 and 108 are closed ten percent of the time and corruption from atomic radiation of the data value stored in memory cells 100 and 101 is reduced by a factor of ten. In another embodiment, switch circuits 106 and 108 are closed one percent of the time and corruption is reduced by a factor of one hundred.

In one embodiment, switch circuits 106 and 108 simultaneously open and close. The same enable signal may control both switch circuits 106 and 108. In another embodiment, switch circuit 106 is closed while switch circuit 108 is open and switch circuit 108 is closed while switch circuit 106 is open.

In FIG. 1A, the access circuit 110 is connected to the outputs of the inverters 102 and 104. Because the access circuit 110 is connected to the output of inverters 102 and 104, the access circuit may directly read the data value stored in memory cell 100. The access circuit 110 should receive complementary values from the memory cell 100.

To write a data value into the memory cell 100, the access circuit 110 should drive complementary values to the memory cell 100. Because the access circuit 110 is connected to the output of inverters 102 and 104, the access circuit should overdrive the outputs of the inverters 102 and 104. The access circuit 110 should have output drivers that are large enough to overpower the outputs of inverters 102 and 104. In addition, the switch circuits 106 and 108 should be closed during a write cycle to allow the written data value to propagate to the inputs of inverters 102 and 104.

In FIG. 1B, the access circuit 110 is connected to the inputs of the inverters 102 and 104. To read the data value from memory cell 101, the switch circuits 106 and 108 should be closed. To write a data value into memory cell 101, the access circuit 110 could overdrive the outputs of inverters 102 and 104 through switch circuits 106 and 108. Alternatively, the switch circuits 106 and 108 may be opened during a write cycle such that access circuit 110 does not need to overdrive the outputs of inverters 102 and 104. After the access circuit 110 has written a data value to the inputs of inverters 102 and 104, the switch circuits 106 and 108 may be closed to retain the data value in the memory cell 101. The access circuit 110 may have small output drivers if the switch circuits 106 and 108 are opened during a write cycle.

Figure 2:
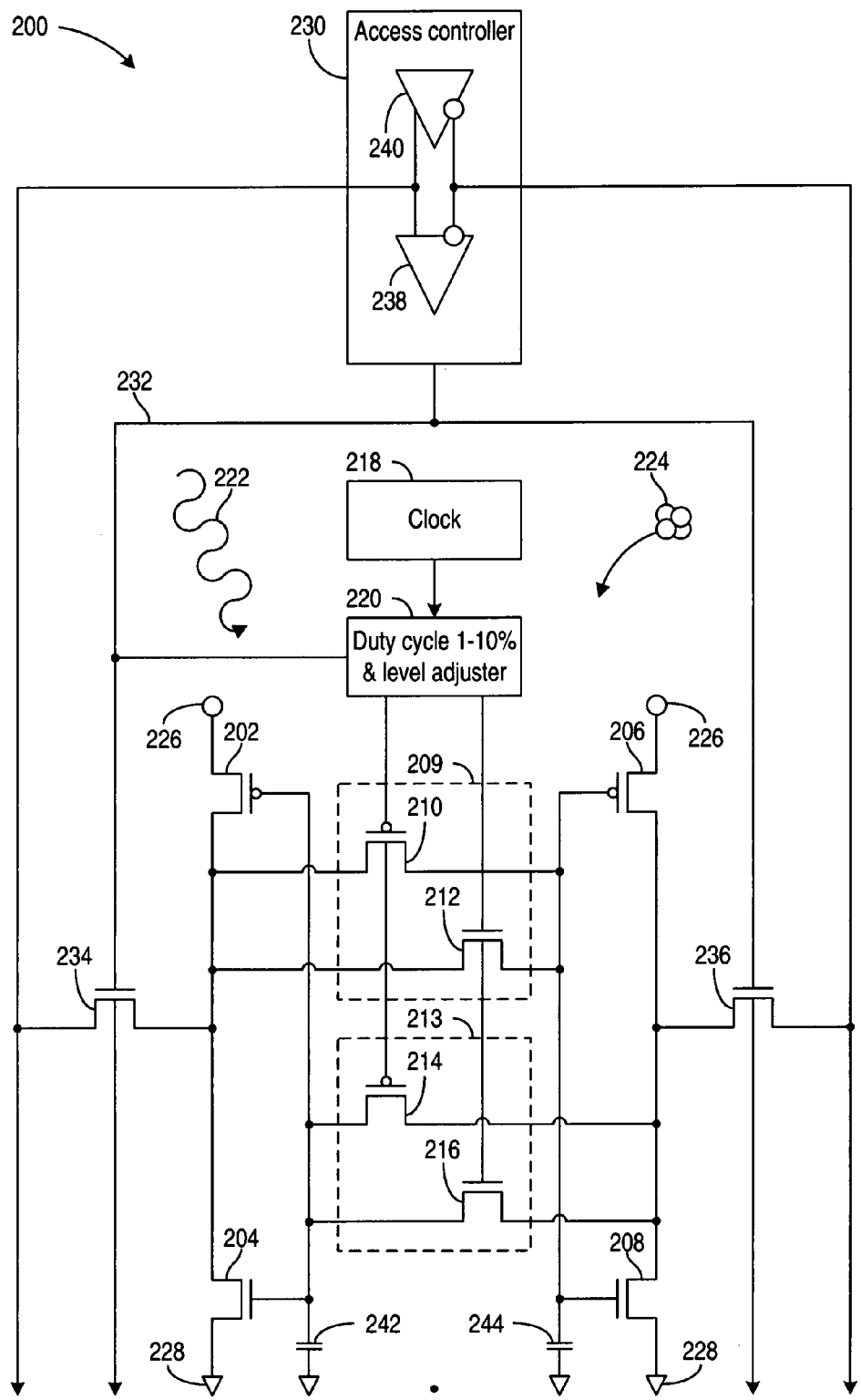
FIG. 2 is a circuit diagram of a memory cell for storing a data bit value in accordance with various embodiments of the invention.

FIG. 2 is a circuit diagram of a memory cell 200 for storing a data bit value in accordance with various embodiments of the invention. The memory cell 200 includes an inverter having PMOS transistor 202 and NMOS transistor 204, and another inverter having PMOS transistor 206 and NMOS transistor 208. The two inverters are cross-coupled by transmission devices 209 and 213. Transmission device 209 is a transmission gate having PMOS transistor 210 and NMOS transistor 212, and transmission device 213 is a transmission gate having PMOS transistor 214 and NMOS transistor 216.

A clock block 218 generates a clock signal for adjuster 220. Adjuster 220 may generate complementary outputs for the PMOS transistors 210 and 214 and for the NMOS transistors 212 and 216. The adjuster 220 may generate signals to turn on the transistors 210, 212, 214, and 216 for between one and ten percent of each period of the clock signal from clock block 218. When the transistors 210, 212, 214, and 216 of the transmission gates are off, data corruption should be prevented from cosmic radiation 222 or an alpha particle 224 from radioactive decay that affects the transistors 202, 204, 206, or 208 of the inverters. Thus, the likelihood of data corruption from atomic radiation that affects transistors 202, 204, 206, or 208 may be reduced by the inverse of the duty cycle. It will be appreciated that the duty cycle may be less than one percent or greater than ten percent in certain embodiments.

FIG. 3A is a circuit diagram of an alternative implementation of each of the transmission devices 209 and 213 of FIG. 2 in accordance with one or more embodiments of the invention. The alternative implementation of each transmission device may be an NMOS transistor 302 with a gate electrode 304 driven by the adjuster 220 of FIG. 2 and source and drain electrodes 306 and 308 for cross-coupling the inverters of FIG. 2.

Adjuster 220 may adjust the drive level of the gate electrode 304 to allow the transmission device of FIG. 3A to couple a high level without attenuation. Adjuster 220 may adjust the drive level above a positive power supply voltage 226 of the inverters by a magnitude of the gate threshold voltage of transistor 302. It will be appreciated that adjuster 220 may adjust the drive level by more or less than the magnitude of the gate threshold voltage of transistor 302.

FIG. 3B is a circuit diagram of another alternative implementation of each of the transmission devices 209 and 213 of FIG. 2 in accordance with one or more embodiments of the invention. Each transmission device could be a PMOS transistor 312 with a gate electrode 314 driven by the adjuster 220 of FIG. 2 and source and drain electrodes 316 and 318 for cross-coupling the inverters of FIG. 2.

Adjuster 220 may adjust the drive level of the gate 314 to allow the transmission device of FIG. 3B to couple a low level without attenuation. Adjuster 220 may adjust the drive level below a negative power supply voltage 228 of the inverters by a magnitude of the gate threshold voltage of transistor 312. It will be appreciated that adjuster 220 may adjust the drive level by more or less than the magnitude of the gate threshold voltage of transistor 312.

Returning to FIG. 2, atomic radiation may also affect the transistors of the transmission devices 209 and 213. In one embodiment, capacitors 242 and 244 are added at the inputs of the inverters. The size of capacitors 242 and 244 may be such that the charge injected from atomic radiation affecting the transistors of the transmission devices 209 and 213 is insufficient to change the logic value stored in capacitors 242 and 244.

In an embodiment with the transmission devices 209 and 213 each being either an NMOS transistor or a PMOS transistor as discussed above, one source/drain region of the transmission device is usually coupled to the input of each inverter. In contrast, a memory cell without these transmission devices has three source/drain regions coupled to the input of each inverter. Thus, the reduced number of source/drain regions coupled to the input of each inverter may reduce data corruption from atomic radiation. In addition, this single source/drain region of the transmission device may be more readily implemented to resist the effects of atomic radiation.

Controller 230 may control read and write access to the memory cell 200. To read the current value of the memory cell 200, the controller 230 may assert the access signal on line 232 to enable the access transistors 234 and 236. Amplifier 238 may detect the current value of the memory cell 200. To write a new value into memory cell 200, the controller may drive complementary values for the new value from amplifier 240. The controller 230 may then assert the access signal on line 232 to enable the access transistors 234 and 236. Amplifier 240 may overdrive the transistors 202, 204, 206, and 208 of the inverters via access transistors 234 and 236. To permit this overdrive, amplifier 240 and access transistors 234 and 236 may need to have a stronger drive capability than inverter transistors 202, 204, 206, or 208.

Adjuster 220 may be coupled to receive the access signal on line 232. During a read or write access to the memory cell 200, adjuster 220 may turn on the transistors 210, 212, 214, and 216 of the transmission devices 209 and 213. It will be appreciated that adjuster 220 could turn on transistors 210, 212, 214, and 216 only for accesses that are write accesses.

FIG. 4 is a flow diagram of a process for storing a data bit value in a memory cell in accordance with various embodiments of the invention. The data bit is retained in the memory cell despite the effects of atomic radiation on the memory cell.

At step 402, the data bit is written into the memory cell. At step 404, the data bit value is transferred from a first inverter in the memory cell to a second inverter in the memory cell. At step 406, a complement to the data bit value is transferred from the second inverter to the first inverter.

At step 408, switch circuits, such as transmission devices, repeatedly couple and decouple the inputs of the two inverters to limit corruption of the data bit value stored in the memory cell. The time multiplexing by the switch circuits may form an equivalent resistance that is the on time of the switch circuit divided by the node capacitance at the input of each inverter. For an equivalent resistance of approximately one megaohm from the switched capacitance, the memory cell may become essentially immune to data corruption from atomic radiation.

At step 410, the data bit value is read from the memory cell.

Figure 5:
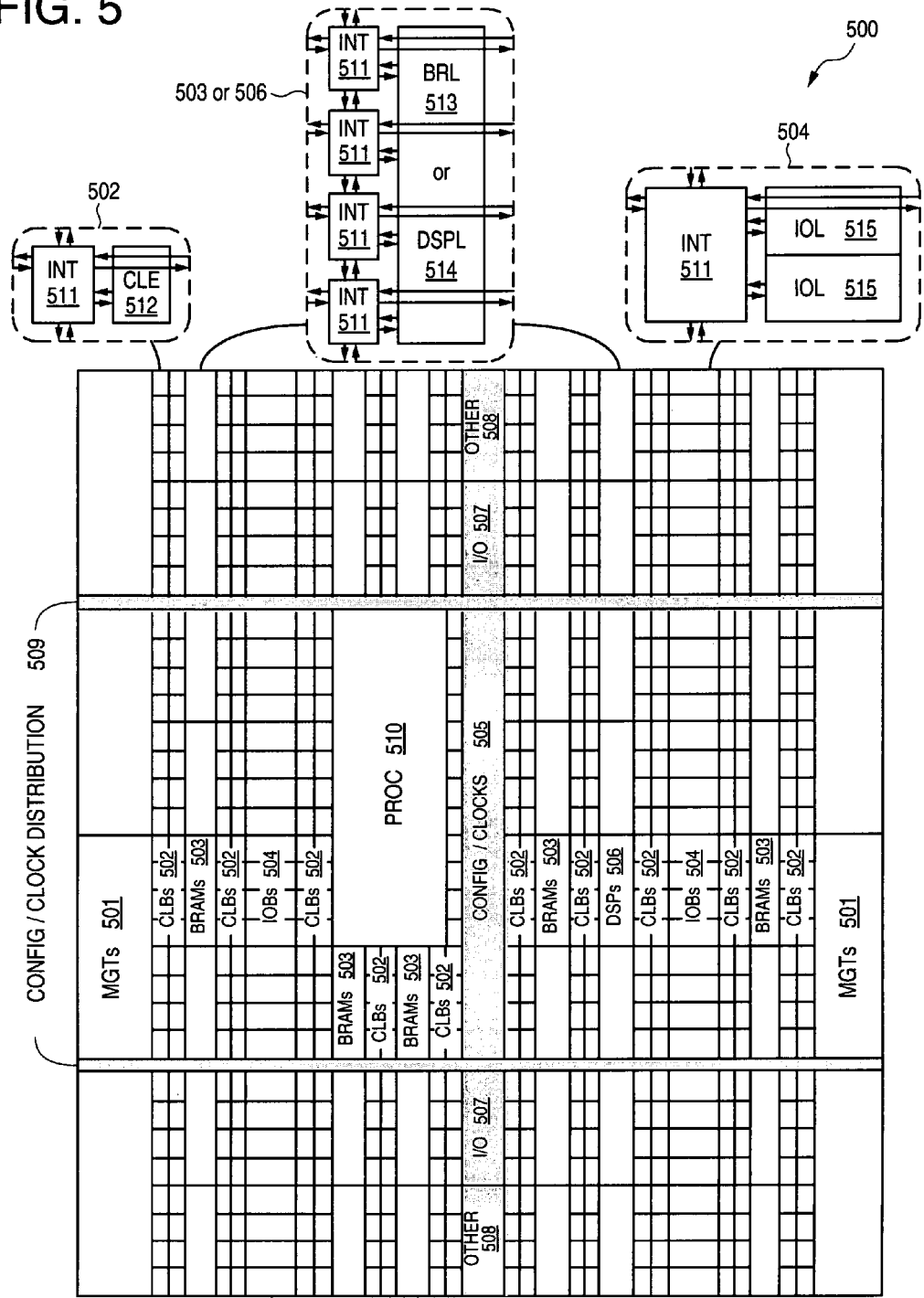
FIG. 5 is a block diagram of a programmable logic device that includes memory cells in accordance with one or more embodiments of the invention.

FIG. 5 is a block diagram of a programmable logic device that includes memory cells in accordance with one or more embodiments of the invention. The configuration memory of the programmable logic device may be implemented to resist the effects of atomic radiation. It will be appreciated that memory of the programmable logic device other than configuration memory may also be implemented to resist the effects of atomic radiation.

Programmable logic devices, such as advanced FPGAs, can include several different types of programmable logic blocks in the array. For example, FIG. 5 illustrates an FPGA architecture 500 that includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An IOB 504 can include, for example, two instances of an input/output logic element (IOL 515) in addition to one instance of the programmable interconnect element (INT 511). As will be clear to those of skill in the art, the actual I/O pads connected, for example, to the I/O logic element 515 are manufactured using metal layered above the various illustrated logic blocks, and typically are not confined to the area of the input/output logic element 515.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

The present invention is thought to be applicable to a variety of systems for storing a data bit value despite atomic radiation. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A memory cell for storing a data bit value despite atomic radiation, the memory cell comprising:
   two inverters comprising first and second inverters each having an input pin and an output pin;
   an access circuit coupled to the two inverters, the access circuit arranged to write and read the data bit value in the memory cell; and
   two switch circuits comprising first and second switch circuits cross coupling the output pins of the first and second inverters to the input pins of the second and first inverters, respectively, the two switch circuits arranged to alternately decouple and couple the input pins and the output pins of the two inverters for limiting corruption from the atomic radiation of the data bit value in the memory cell.

2. The memory cell of claim 1, wherein the atomic radiation comprises cosmic radiation or atomic byproducts of radioactive decay.

3. The memory cell of claim 1, wherein the data bit value in the memory cell remains uncorrupted in response to the atomic radiation that affects a value at the output pin of at least one of the two inverters within a time period in which the two switch circuits are decoupling the input pins from the output pins of the two inverters.

4. The memory cell of claim 1, wherein:
   the first and second switch circuits include first and second transmission devices, respectively; and
   the first transmission device couples the output pin of the first inverter to the input pin of the second inverter and the second transmission device couples the output pin of the second inverter to the input pin of the first inverter.

5. The memory cell of claim 4, wherein the access circuit includes a first and second transistor, the first transistor coupling a data line to the input pin of the second inverter and the second transistor coupling an inverted data line to the input pin of the first inverter.

6. The memory cell of claim 4, wherein the access circuit includes a first and second transistor, the first transistor coupling a data line to the output pin of the first inverter and the second transistor coupling an inverted data line to the output pin of the second inverter.

7. The memory cell of claim 4, wherein the first and second transmission devices comprise NMOS transistors that couple the output pins of the two inverters to the input pins of the two inverters in response to a voltage applied to respective gates of the NMOS transistors that is greater than a positive power supply voltage of the two inverters by at least a magnitude of a threshold voltage of the NMOS transistors.

8. The memory cell of claim 4, wherein the first and second transmission devices comprise PMOS transistors that couple the output pins of the two inverters to the input pins of the two inverters in response to a voltage applied to respective gates of the PMOS transistors that is less than a negative power supply voltage of the two inverters by at least a magnitude of a threshold voltage of the PMOS transistors.

9. The memory cell of claim 4, wherein the first and second transmission devices each comprise a parallel combination of an NMOS transistor and a PMOS transistor that couples the output pins of the two inverters to the input pins of the two inverters in response to a respective first voltage applied to a gate of each of the NMOS and PMOS transistors and that decouples the input pins from the output pins of the two inverters in response to a respective second voltage applied to the gates of the NMOS and PMOS transistors.

10. The memory cell of claim 1, wherein the two switch circuits decouple the input pins of the two inverters from the output pins of the two inverters within each occurrence of a clock period for greater than nine-tenths of the clock period.

11. The memory cell of claim 10, wherein the two switch circuits couple the output pins of the two inverters to the input pins of the two inverters within each occurrence of the clock period for a portion of the clock period less than the nine-tenths of the clock period.

12. The memory cell of claim 1, wherein the two switch circuits are arranged to alternately provide a high impedance and a low impedance at the input pins of the two inverters for limiting corruption from the atomic radiation of the data bit value stored in the memory cell.

13. The memory cell of claim 12, wherein the two switch circuits are arranged to concurrently provide the high impedance at the input pins of the two inverters.

14. The memory cell of claim 12, wherein the two switch circuits are arranged to provide the high impedance at the input pins of the two inverters during a fraction of each period of a clock signal that is greater than nine-tenths of the period.

15. The memory cell of claim 14, wherein the two switch circuits are arranged to provide the high impedance at the input pins of the two inverters during the fraction of each period that is greater than ninety-nine one-hundredths of the period.

16. The memory cell of claim 1, further comprising two capacitances, each coupled to the input pin of a respective one of the two inverters.

17. The memory cell of claim 16, wherein the data bit value in the memory cell is retained in the two capacitances in response to the atomic radiation affecting at least one of the two switch circuits.

18. The memory cell of claim 1, wherein the memory cell stores a value of a configuration bit for programming an array of programmable logic and interconnect resources of a programmable logic device.

19. A circuit for storing a data bit value in a memory cell despite atomic radiation, the circuit comprising:
   means for writing the data bit value into the memory cell, the memory cell including first and second inverters;
   means for transferring the data bit value from an output pin of the first inverter to an input pin of the second inverter via a first switch circuit;
   means for transferring a complement of the data bit value from an output pin of the second inverter to an input pin of the first inverter via a second switch circuit;
   means for repeatedly decoupling the input pins of the second and first inverters from the output pins of the first and second inverters with the first and second switch circuits, whereby corruption from the atomic radiation of the data bit value in the memory cell is limited; and
   means for reading the data bit value from the memory cell.

20. The circuit of claim 19, further comprising:
   means for retaining the data bit value in a first capacitance at the input pin of the second inverter in response to the atomic radiation affecting the first switch circuit; and
   means for retaining the complement of the data bit value in a second capacitance at the input pin of the first inverter in response to the atomic radiation affecting the second switch circuit.

* * * * *